(12) United States Patent
Dutta et al.

(10) Patent No.: US 12,740,405 B2
(45) Date of Patent: Sep. 15, 2026

(54) BIMETALLIC FUSE ELEMENT BETWEEN METAL LEVELS

(71) Applicant: INTERNATIONAL BUSINESS MACHINES CORPORATION, Armonk, NY (US)

(72) Inventors: Ashim Dutta, Clifton Park, NY (US); Chih-Chao Yang, Glenmont, NY (US); Mitali Gogate, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 368 days.

(21) Appl. No.: 18/396,771

(22) Filed: Dec. 27, 2023

(65) Prior Publication Data

US 2025/0218935 A1 Jul. 3, 2025

(51) Int. Cl.
*H10W 20/49* (2026.01)
*H10W 20/42* (2026.01)

(52) U.S. Cl.
CPC ......... *H10W 20/493* (2026.01); *H10W 20/42* (2026.01)

(58) Field of Classification Search
CPC .................................................... H10W 20/493
See application file for complete search history.

(56) References Cited

U.S. PATENT DOCUMENTS 4,227,168 A 10/1980 Knapp, Jr.
4,228,417 A 10/1980 Belcher
4,240,058 A 12/1980 Kozacka
4,245,208 A 1/1981 Belcher
4,254,394 A 3/1981 Kozacka
4,272,752 A 6/1981 Jacobs, Jr.
4,306,212 A 12/1981 Belcher
5,641,703 A 6/1997 Cohen
6,754,135 B2 6/2004 Pilo
6,897,543 B1 5/2005 Huang
6,998,865 B2 2/2006 Bard
7,157,782 B1 1/2007 Shih
7,272,067 B1 9/2007 Huang (Continued)

OTHER PUBLICATIONS

Kothandaraman et al., “Electrically Programmable Fuse (eFUSE) Using Electromigration in Silicides”, IEEE Electron Device Letters, vol. 23, No. 9, Sep. 2002, pp. 523-525.

(Continued)

*Primary Examiner* — Evren Seven
(74) *Attorney, Agent, or Firm* — Robert R. Aragona

(57) ABSTRACT

A fuse element including a first bimetallic pillar disposed between and electrically connecting a first metal level to a second metal level, the first bimetallic pillar comprises a first metal strip adjacent to a second metal strip. A fuse element including a first bimetallic pillar disposed between and electrically connecting a first metal level to a second metal level, the first bimetallic pillar includes a first metal strip adjacent to a second metal strip, a first width of the second metal strip is substantially equal to a width of the bimetallic pillar. A fuse element including a first bimetallic pillar disposed between and electrically connecting a first metal level to a second metal level, the first bimetallic pillar includes a first metal strip adjacent to a second metal strip, the second metal strip is physically disposed between a bottom surface of the first metal strip and the first metal level.

20 Claims, 5 Drawing Sheets

(56) References Cited

U.S. PATENT DOCUMENTS

| | | | | |
|---|---|---|---|---|
| 7,388,273 | B2 | 6/2008 | Burr | |
| 7,656,005 | B2 | 2/2010 | Booth, Jr. | |
| 8,053,809 | B2 | 11/2011 | Cheng | |
| 8,400,813 | B2 | 3/2013 | Lee | |
| 10,319,677 | B2 | 6/2019 | Cheng | |
| 10,790,161 | B2 | 9/2020 | Baloglu | |
| 10,804,278 | B2 | 10/2020 | Balakrishnan | |
| 11,170,964 | B2 | 11/2021 | Telefus | |
| 2008/0296728 | A1* | 12/2008 | Yang .................. | H10W 20/493<br>257/E21.585 |
| 2012/0187528 | A1 | 7/2012 | Cheng | |
| 2012/0248567 | A1* | 10/2012 | Lu-Chen Hsu ..... | H10W 20/493<br>257/E23.149 |
| 2013/0147008 | A1* | 6/2013 | Poppe ................ | H10W 20/493<br>257/E23.149 |
| 2022/0148839 | A1 | 5/2022 | Topcagic | |

OTHER PUBLICATIONS

Rizzolo et al., "IBM System z9 eFUSE applications and methodology," IBM Journal of Research and Development, vol. 51, No. 1/2, Jan./Mar. 2007, pp. 65-75.

* cited by examiner

BIMETALLIC FUSE ELEMENT BETWEEN METAL LEVELS

BACKGROUND

The present invention generally relates to semiconductor structures, and more particularly to bimetallic fuse elements between metal levels.

Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact formation. Layers of interconnections are formed above these logical and functional layers during the BEOL processing to complete the integrated circuit structure. BEOL processing generally involves the formation of insulators and conductive wiring. The industry has typically used copper as the conductive metal for the interconnect structures most often using a dual damascene process to form a metal line/via interconnect structure.

A fuse is an interconnect structure that is normally "on" meaning that current is flowing, but once "programmed" it is "off" meaning that current does not flow. In a fuse, programming means applying a suitable voltage so that the fuse "blows" to create an open circuit or high resistance state. An antifuse is an interconnect structure that is normally "off" meaning that no current flows, but once "programmed" it is "on" meaning that current does flow. In an antifuse, programming means applying a suitable voltage to two electrodes and forming a conductive link between them to close the circuit.

In integrated circuitry memory devices, fuses and antifuses can be used for activating redundancy in memory chips and for programming functions and codes in logic chips. Specifically, dynamic random access memory (DRAM) and static random access memory (SRAM) may use fuses and antifuses for such purposes. In addition, fuses and antifuses can also be used to prevent decreased chip yield caused by random defects generated in the manufacturing process. Moreover, fuses and anti-fuses provide for future customization of a standardized chip design. For example, fuses and anti-fuses may provide for a variety of voltage options, packaging pin out options, or any other options desired by the manufacturer to be employed prior to the final processing. These customization possibilities make it easier to use one basic design for several different end products and help increase chip yield.

A fuse or an electrical fuse (eFuse) may be used to implement array redundancy, field programmable arrays, analog component trimming circuits, and chip identification circuits. A conventional fuse link dimension is limited by allowable photolithographic minimal dimensions. Programming of a conventional fuse typically takes a substantial amount of current, which is undesirable in current technology node devices using low driving current.

SUMMARY

According to an embodiment of the present invention, a fuse element is provided. The fuse element including a first bimetallic pillar disposed between and electrically connecting a first metal level to a second metal level, where the first bimetallic pillar includes a first metal strip adjacent to a second metal strip.

According to another embodiment of the present invention, a fuse element is provided. The fuse element including a first bimetallic pillar disposed between and electrically connecting a first metal level to a second metal level, where the first bimetallic pillar includes a first metal strip adjacent to a second metal strip, and where a first width of the second metal strip is substantially equal to a width of the bimetallic pillar.

According to another embodiment of the present invention, a fuse element is provided. The fuse element including a first bimetallic pillar disposed between and electrically connecting a first metal level to a second metal level, where the first bimetallic pillar includes a first metal strip adjacent to a second metal strip, where the second metal strip is physically disposed between a bottom surface of the first metal strip and the first metal level.

BRIEF DESCRIPTION OF THE DRAWINGS

The following detailed description, given by way of example and not intended to limit the invention solely thereto, will best be appreciated in conjunction with the accompanying drawings, in which.

Figure 1:
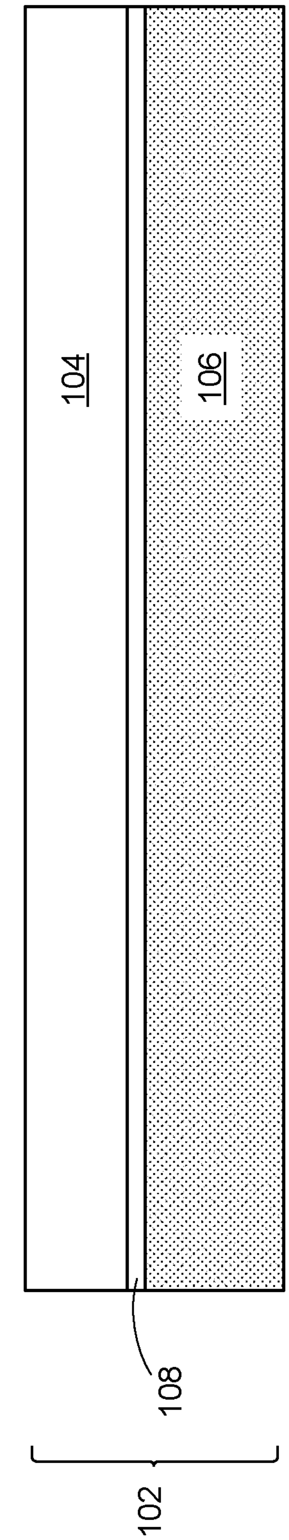
FIG. 1 illustrates a cross-sectional view of a semiconductor structure during an intermediate step of a method of fabricating an interconnect structure, according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor structures, and more particularly to bimetallic fuse elements between metal levels. More specifically, the bimetallic fuse elements and associated method disclosed herein enable a flexible fuse link design that is scalable to sub-lithographic dimensions, has lower current requirements, and is compatible with back-end-of-line processes. Exemplary embodiments of the bimetallic fuse elements are described in detail below by referring to the accompanying drawings in FIGS. 1 to 5. Those skilled in the art will readily appreciate that the detailed description given herein with respect to these figures is for explanatory purposes as the invention extends beyond these limited embodiments.

Referring now to FIG. 1, a demonstrative illustration of a structure 100 is shown during an intermediate step of a method of fabricating bimetallic fuse elements according to an embodiment of the invention. More specifically, the structure 100 illustrated in FIG. 1 includes a first metal level 102 which may be one of several back-end-of-line layers. In general, the back-end-of-line layers provide "wiring" or electrical connections to underlying transistors.

For purposes of illustration, the first metal level 102 of the present embodiment includes a first conductor 104 formed in a first interlayer dielectric 106, as is well known and understood by persons skilled in the art. The first metal level 102 represents any one of a front-end-of-line device layer, a middle-of-line metal layer, or a back-end-of-line metal layer. The first conductor 104 may be any conductor, such as, for example, lines, vias, contacts, top via contacts, etc. In at least one example, the first conductor 104 represents metal lines or traces in a middle-of-line metal layer or a back-end-of-line metal layer. Additionally, one or more first barrier layers 108 may be used to separate the first conductor 104 from the first interlayer dielectric 106 as is well known in the art. The first interlayer dielectric 106 may include any suitable dielectric material, for example, oxide, nitride, silicon oxide ($SiO_2$), silicon nitride ($Si_3N_4$), hydrogenated silicon carbon oxide (SiCOH), carbon rich silicon carbon nitride (SiCN), silicon based low-κ dielectrics, porous dielectrics, or some combination thereof. The term "low-κ" as used herein refers to a material having a relative dielectric constant k which is lower than that of silicon dioxide.

The first conductor 104 is formed from a conductive interconnect material which is blanket deposited on top of the structure 100, and directly on a top surface of the first barrier layers 108, filling a trench (not shown). The conductive interconnect material may include materials such as, for example copper (Cu), ruthenium (Ru), cobalt (Co), tungsten (W). The conductive interconnect material may further include metal nitrides such as, for example tantalum nitride (TaN) and titanium nitride (TiN). The conductive interconnect material can be formed by for example, chemical vapor deposition (CVD), physical vapor deposition (PVD), and atomic layer deposition (ALD) or a combination thereof. The first conductor 104 is formed by damascene, or subtractively patterned from the conductive material layer, using known patterning and etching techniques.

According to the disclosed embodiments, the first conductor 104 is generally arranged parallel to the cross-section view of the structure 100 illustrated in FIG. 1; however, other arrangements and positions are explicitly contemplated. Finally, although only a single first conductor 104 is shown in the figures, the structure 100 may include any number of first conductors 104.

The first barrier layers 108 separate the conductive interconnect material of the first conductor 104 from the first interlayer dielectric 106. The first barrier layers 108 may be composed of, for example, tantalum nitride (TaN), tantalum (Ta), titanium (Ti), or a combination thereof. The first barrier layers 108 may be deposited utilizing a conventional deposition process such as, for example, CVD, plasma enhanced chemical vapor deposition (PECVD), PVD or ALD. The first barrier layers 108 may be 5 nm thick, although a thickness less than or greater than 5 nm may be acceptable.

Figure 2:
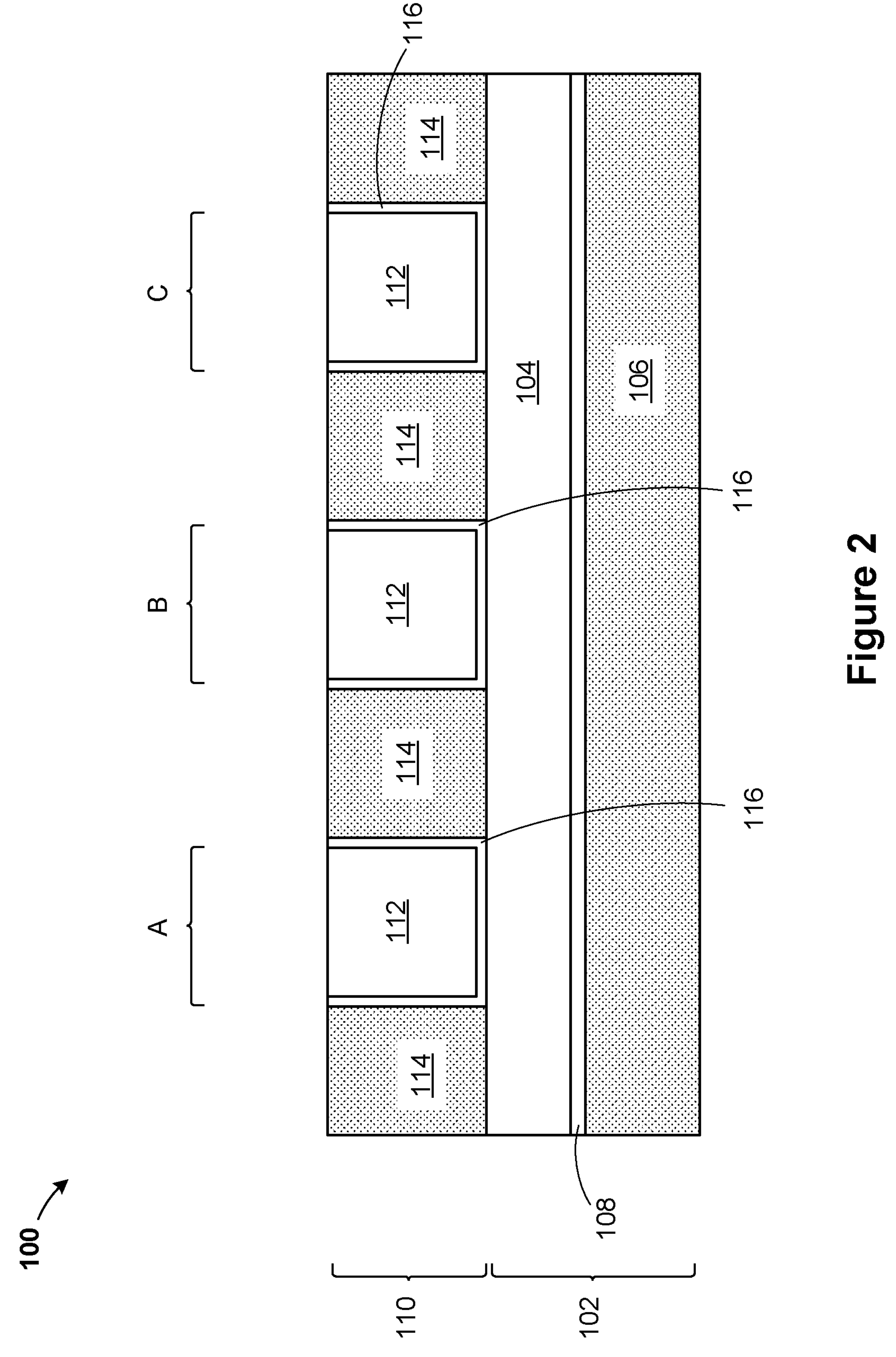
FIG. 2 illustrates a cross-sectional view of the semiconductor structure and illustrates forming a metal via level, according to an exemplary embodiment.

Referring now to FIG. 2, the structure 100 is shown after forming a via level 110 according to an embodiment of the invention. For purposes of illustration, the via level 110 of the present embodiment is formed directly on the first metal level 102 and includes vias 112 formed in a second interlayer dielectric 114, as is well known and understood by persons skilled in the art.

The via level 110 represents any one of a front-end-of-line device layer, a middle-of-line metal layer, or a back-end-of-line metal layer. The vias 112 may be any conductor generally arranged, and providing an electrical connection, between two metal levels. For example, via level 110 will provide electrical connections between the first metal level 102 and a metal level subsequently formed thereon. Additionally, one or more second barrier layers 116 may be used to separate the vias 112 from the second interlayer dielectric 114 as is well known in the art. The second interlayer dielectric 114 may include any suitable dielectric material, for example, oxide, nitride, silicon oxide ($SiO_2$), silicon nitride ($Si_3N_4$), hydrogenated silicon carbon oxide (SiCOH), carbon rich silicon carbon nitride (SiCN), silicon based low-κ dielectrics, porous dielectrics, or some combination thereof.

The vias 112 are formed from a conductive interconnect material which is blanket deposited on top of the structure 100, and directly on a top surface of the second barrier layers 116, filling a trench (not shown). The conductive interconnect material may include materials such as, for example copper (Cu), aluminum (Al), ruthenium (Ru), cobalt (Co), tungsten (W). The conductive interconnect material can be formed by for example, chemical vapor deposition (CVD), physical vapor deposition (PVD), and atomic layer deposition (ALD) or a combination thereof. The vias 112 is formed by damascene, or subtractively patterned from the conductive material layer, using known patterning and etching techniques. In an embodiment, the vias 112 are made from the same conductive interconnect material as the first conductor 104. For example, both the first conductor 104 and the vias 112 may be made from a single metal such as copper or aluminum. In another embodiment, the vias 112 are made from a different conductive interconnect material as the first conductor 104. For example, the first conductor 104 may be made from a metal nitride, such as tungsten nitride, tantalum nitride, or titanium nitride, while the vias 112 may be made from a single metal such as copper or aluminum.

According to the disclosed embodiments, the vias 112 are generally disposed above, and in electrical contact, with an underlying conductor, for example the first conductor 104. Finally, although only three vias 112 are shown, the structure 100 may include any number of vias 112.

The second barrier layers 116 separate the conductive interconnect material of the vias 112 from the second interlayer dielectric 114. The second barrier layers 116 may be composed of, for example, tantalum nitride (TaN), tantalum (Ta), titanium (Ti), or a combination thereof. The second barrier layers 116 may be deposited utilizing a conventional deposition process such as, for example, CVD, plasma enhanced chemical vapor deposition (PECVD), PVD or ALD. The second barrier layers 116 may be 5 nm thick, although a thickness less than or greater than 5 nm may be acceptable.

Figure 3:
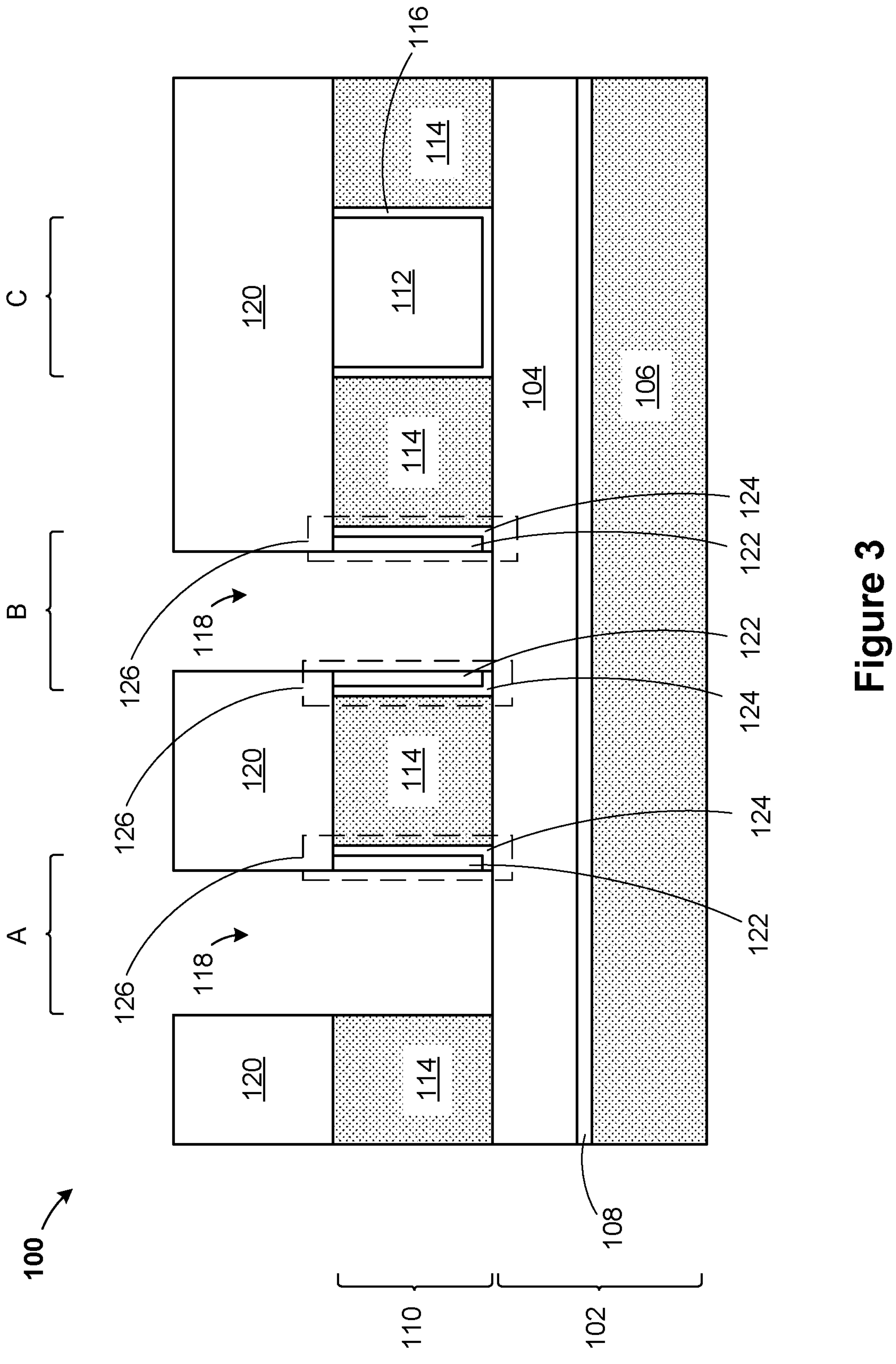
FIG. 3 illustrates a cross-sectional view of the semiconductor structure and illustrates removing portions of vias of the metal via level and forming openings, according to an exemplary embodiment.

Referring now to FIG. 3, the structure 100 is shown after removing portions of the vias 112 and forming openings 118 according to an embodiment of the invention.

First, a mask 120 is formed directly on top of the first metal level 102 as illustrated and according to known techniques. The mask 120 can include any known dielectric hard mask materials suitable for facilitating subsequent patterning and etching techniques. In all cases, the mask 120 is preferably made from a dielectric material which is capable of being etched or patterned selective to the second interlayer dielectric 114 and the vias 112. For example, the mask 120 can include nitrides, such as, silicon nitride, titanium nitride, tantalum nitride, aluminum nitride, or silicon carbon nitride. In at least one embodiment, for example, the mask 120 is a layer of silicon nitride. In another embodiment, the mask 120 is a layer of silicon carbon nitride. Finally, the mask 120 is sacrificial in nature because some or all of it will be removed during subsequent processes and will no longer be present in the final structure. The mask 120 can be formed by any deposition technique including, for example, chemical vapor deposition (CVD), plasma enhanced chemical vapor deposition (PECVD), physical vapor deposition (PVD), sputtering, or atomic layer deposition. In an alternative embodiment, the mask 120 is an organic planarization layer or a layer of material that is capable of being planarized or etched by known techniques. In an embodiment, for example, the organic planarization layer can be an amorphous carbon layer able to withstand the high temperatures of subsequent processing steps.

Next, the openings 118 are formed by transferring the pattern of the mask 120 into the via level 110 immediately below according to known techniques. Specifically, portions of the vias 112 and the second barrier layers 116 are removed selective to the mask 120. For example, in Region A, portions of the via 112 and the second barrier layers 116 are removed and portions remain only along one sidewall of the opening 118; in Region B central portions of the via 112 and the second barrier layers 116 are removed and portions remain only along opposite sidewalls of the opening 118; and in Region C no portions the via 112 or the second barrier layer 116 are removed. In all cases, a top surface of the first conductor 104 will be exposed at bottoms of the openings 118. Additionally, Regions A, B, and C represent exemplary embodiments and the structure 100 may include any combination of the features illustrated and described with respect to Regions A, B, and C.

Remaining portions of the vias 112 and the second barrier layers 116 are hereinafter referred to as a first metal strip 122 and a second metal strip 124, respectively. Together the first metal strip 122 and a second metal strip 124 form a bimetallic pillar 126. It should be noted, the first metal strip 122 remains separated from the first conductor 104 by a small portion of the second metal strip 124, as illustrated. Said differently, the second metal strip 124 directly contacts a sidewall and a bottom of the first metal strip 122. Finally, an uppermost surface of the first metal strip 122 will be flush, or substantially flush, with an uppermost surface of the second metal strip 124.

Figure 4:
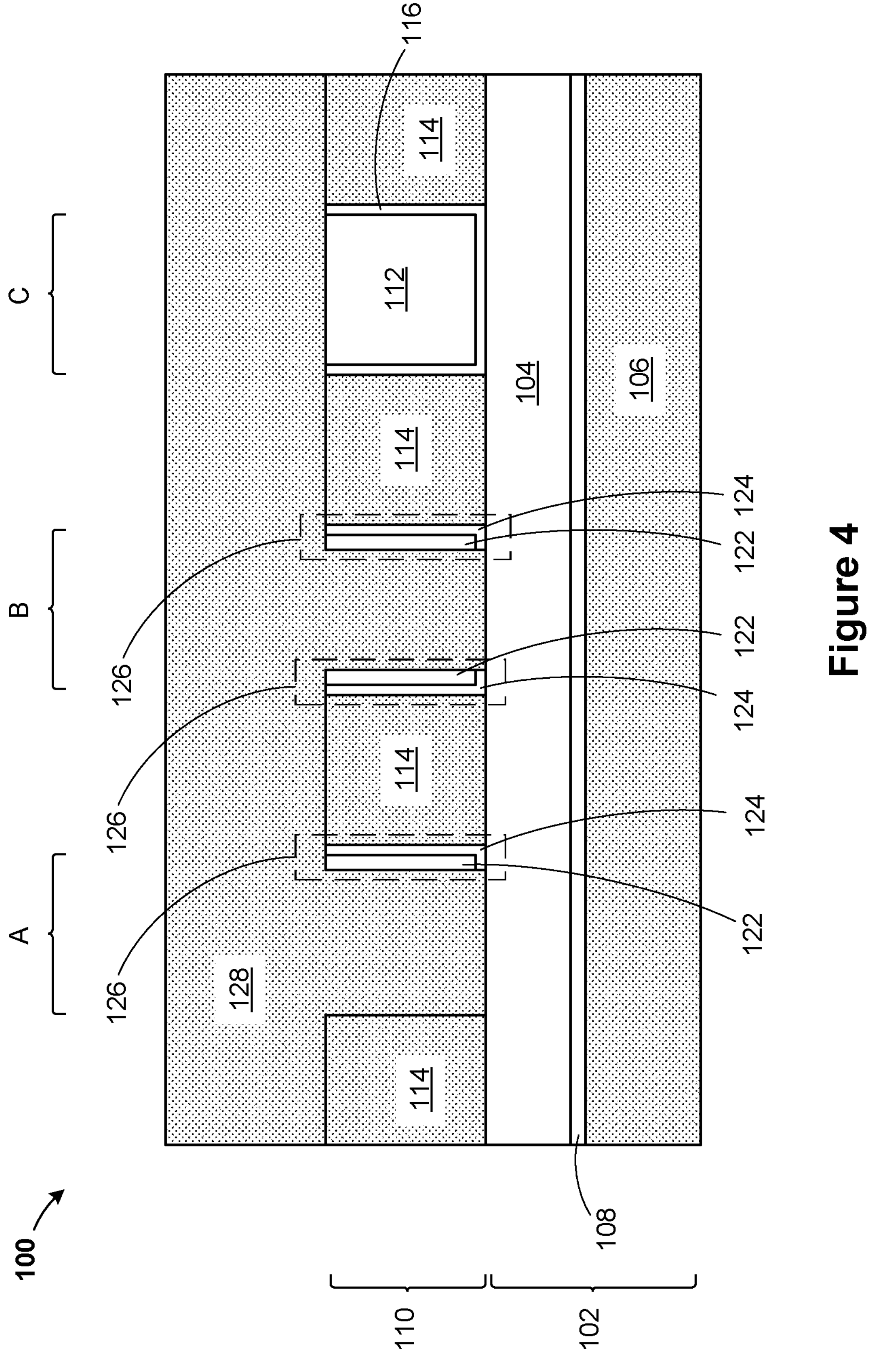
FIG. 4 illustrates a cross-sectional view of the semiconductor structure and illustrates forming an interlayer dielectric, according to an exemplary embodiment

Referring now to FIG. 4, the structure 100 is shown after forming a third interlayer dielectric 128 according to an embodiment of the invention.

First, the mask 120 is removed according to known techniques. Next the third interlayer dielectric 128 is formed according to known techniques. Specifically, the third interlayer dielectric 128 is blanket deposited across the structure 100 and within the openings 118. In an embodiment, the third interlayer dielectric 128 includes the same dielectric material as the first interlayer dielectric 106, the second interlayer dielectric 114, or both. In another embodiment, the third interlayer dielectric 128 is a different dielectric material than the first interlayer dielectric 106, the second interlayer dielectric 114, or both. In all cases, the third interlayer dielectric 128 fills the openings 118 and is deposited to a thickness sufficient to provide the base for a subsequent metal level.

Figure 5:
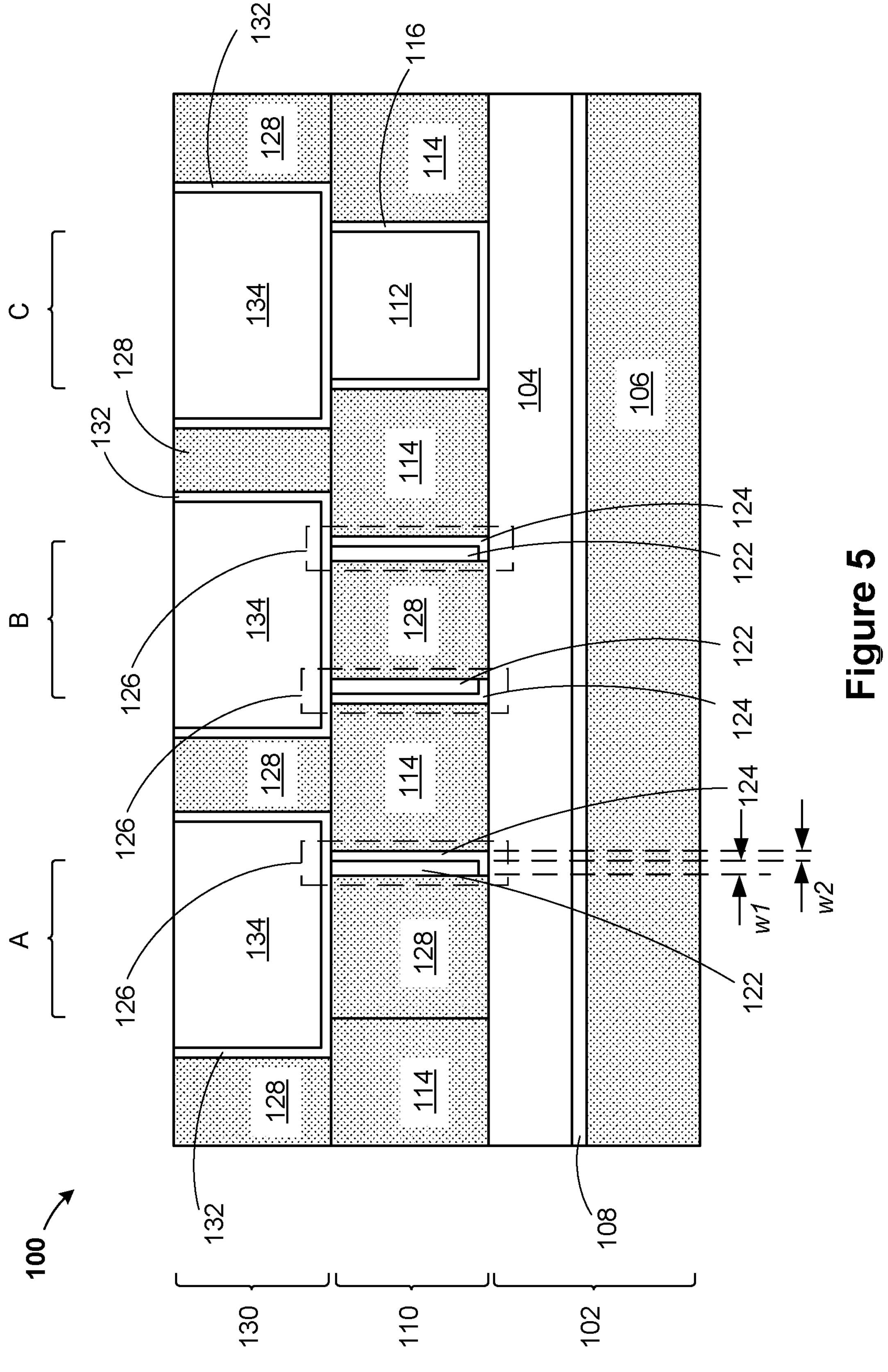
FIG. 5 illustrates a cross-sectional view of the semiconductor structure and illustrates forming a second metal level, according to an exemplary embodiment.

Referring now to FIG. 5, the structure 100 is shown after forming a second metal level 130 according to an embodiment of the invention.

For purposes of illustration, the second metal level 130 of the present embodiment includes second conductors 134 formed in the third interlayer dielectric 128, as is well known and understood by persons skilled in the art. The second metal level 130 represents any one of a front-end-of-line device layer, a middle-of-line metal layer, or a back-end-of-line metal layer. The second conductors 134 may be any conductor, such as, for example, lines, vias, contacts, top via contacts, etc. In at least one example, the second conductors 134 represents metal lines or traces in a middle-of-line metal layer or a back-end-of-line metal layer. Additionally, one or more third barrier layers 132 may be used to separate the second conductors 134 from the third interlayer dielectric 128 as is well known in the art.

The second conductors 134 are formed from a conductive interconnect material which is blanket deposited on top of the structure 100, and directly on a top surface of the third barrier layers 132, filling a trench (not shown). The conductive interconnect material may include materials such as, for example copper (Cu), ruthenium (Ru), cobalt (Co), tungsten (W). The conductive interconnect material may further include metal nitrides such as, for example tantalum nitride (TaN) and titanium nitride (TiN). The conductive interconnect material can be formed by for example, chemical vapor deposition (CVD), physical vapor deposition (PVD), and atomic layer deposition (ALD) or a combination thereof. As illustrated the second conductors 134 are formed by damascene process; however, they may alternatively be subtractively patterned using known patterning and etching techniques.

According to the disclosed embodiments, the second conductors 134 are generally arranged perpendicular to the cross-section view of the structure 100 illustrated in FIG. 5; however, other arrangements and positions are explicitly contemplated. Finally, although only three second conductors 134 are show in FIG. 5, the structure 100 may include any number of second conductors 134.

The third barrier layers 132 separate the conductive interconnect material of the second conductors 134 from the third interlayer dielectric 128 and the second interlayer dielectric 114. The third barrier layers 132 may be composed of, for example, tantalum nitride (TaN), tantalum (Ta), titanium (Ti), or a combination thereof. The third barrier layers 132 may be deposited utilizing a conventional deposition process such as, for example, CVD, plasma enhanced chemical vapor deposition (PECVD), PVD or ALD. The third barrier layers 132 may be 5 nm thick, although a thickness less than or greater than 5 nm may be acceptable.

A planarization process, such as, for example, chemical mechanical polishing (CMP), may be done to remove excess material from a top surface of the structure 100 such that upper horizontal surfaces of the second conductors 134, the third barrier layers 132 and third interlayer dielectric 128 are coplanar, or substantially coplanar.

As illustrated in FIG. 5, the bimetallic pillars 126 each form an electrical connection between the first metal level 102 and the second metal level 130. More specifically, each of the bimetallic pillars 126 form an electrical connection between the first conductor 104 and one of the second conductors 134. In the structure 100, the bimetallic pillar 126 in Region A provides a single electrical connection between the first conductor 104 and one of the second conductors 134. The single bimetallic pillar 126, as depicted in Region A, provides a single fuse element or a single fuse link. Meanwhile, the two bimetallic pillars 126 in Region B provide two electrical connections between the first conductor 104 and another one of the second conductors 134. The two bimetallic pillars 126, as depicted in Region B, provide two fuse elements or two fuse links. Designs may require multiple fuse elements to achieve different fuse characteristics. For example, multiple fuse elements may offer redundancy or alternatively increase the current required to program the fuse. As such, despite only limited numbers of bimetallic pillars 126 being illustrated in the figures, embodiments of the present invention explicitly contemplate any number of bimetallic pillars 126 may be formed between two metal levels.

As previously described above, each bimetallic pillar 126 includes the first metal strip 122 (i.e. remaining portions of the vias 112) and the second metal strip 124 (i.e. remaining portions of the second barrier layers 116). According to embodiments of the present invention, at least one of the first metal strip 122 or the second metal strip 124 has a higher electrical conductively than then other. Stated differently, the first metal strip 122 and the second metal strip 124 will have different electrical conductivities. In yet another embodiment, for example, an electrical conductivity of the first metal strip 122 is relatively higher than an electrical conductivity of the second metal strip 124.

The different electrical conductivities affect programming characteristics of the fuse element. Specifically, the different electrical conductivities of the first metal strip 122 and the second metal strip 124 can change the effective size or critical dimension of the fuse element. For example, despite the bimetallic pillar 126 having a width defined by lithography, an effective width of the operable fuse element would otherwise be determined by an individual width of the metal strip having the higher electrical conductivity. In such cases, current will travel along the metal strip having the higher electrical conductivity. Therefore, a width of the bimetallic pillar 126, and thus an effective with of the fuse element, is adjustable to achieve desired programming characteristics.

Further, according to embodiments of the present invention, at least one of the first metal strip 122 or the second metal strip 124 has a higher electrical resistivity than then other. Stated differently, the first metal strip 122 and the second metal strip 124 will have different electrical resistivities. In yet another embodiment, for example, an electrical resistivity of the first metal strip 122 is relatively lower than an electrical resistivity of the second metal strip 124. In an embodiment, an electrical resistivity of the second metal strip 124 is approximately 100 times an electrical resistivity of the first metal strip 122. For example, an electrical resistivity of the second metal strip 124 is greater than approximately 1000 micro ohm centimeter, and an electrical resistivity of the first metal strip 122 is less than approximately 10 micro ohm centimeter.

Like electrical conductivity, the different electrical resistivities affect programming characteristics of the fuse element. Specifically, the different electrical resistivities of the first metal strip 122 and the second metal strip 124 can change the effective size or critical dimension of the fuse element. For example, despite the bimetallic pillar 126 having a width defined by lithography, an effective width of the operable fuse element would otherwise be determined by an individual width of the metal strip having the lower electrical resistivity, which the first metal strip 122. In such cases, programming current will travel along the metal strip having the lower electrical resistivity, which is the first metal strip 122. Therefore, a width of the bimetallic pillar 126, and thus an effective width of the fuse element, is adjustable to achieve desired programming characteristics.

In all cases, and according to embodiment of the present invention, the first metal strip 122 (i.e. remaining portions of the vias 112) is lower resistance, higher conductivity, and relatively wider than the second metal strip 124 (i.e. remaining portions of the second barrier layers 116). As such, the electrical properties, and the actual width of the first metal strip 122 delineate fuse operation. A width of the first metal strip 122 is illustrated as w1 in FIG. 5. A width of the second metal strip 124 is illustrated as w2. An additional width of the second metal strip 124 w1 plus w2, at an upper surface of the first metal level 102, where a portion of the second metal strip 124 is below the first metal strip 122. In an embodiment, w1 is less than 10 nm and w2 is less than 5 nm. In a preferred embodiment, w1 is as small as possible without completely removing the first metal strip 122. The first metal strip 122 and the second metal strip 122 are both required for the bimetallic pillars 126.

Unlike conventional structures, the bimetallic pillars 126 disclosed herein enable fabrication of a fuse element having an effective width or critical dimension which is less than otherwise achievable using known photolithographic techniques. Additionally, programming currents for the fuse element made from the bimetallic pillar 126 will be lower than conventional fuse elements of similar fuse structures.

Additionally, as previously discussed above, the effective width of the operational fuse element will be less than a total width of the bimetallic pillar 126. It is noted that stand alone fuse elements having a similar width as the effective width of the operational fuse element described herein are inherently unstable and likely cannot be fabricated. As such, the bimetallic pillar 126 disclosed herein enables fabrication of a structurally stable fuse element having a reduced effective width.

As illustrated in FIG. 5, the bimetallic fuse elements represented by the structure 100 has some distinctive notable features. Unlike conventional structures, the bimetallic pillar 126 disclosed herein enables fabrication of a fuse element having an effective width or critical dimension which is less than otherwise achievable using known photolithographic techniques. Additionally, programming currents for the fuse element made from the bimetallic pillar 126 will be lower than conventional fuse elements of similar structures.

With continued reference to FIG. 5, embodiments of this invention include a fuse element. The fuse element including a first bimetallic pillar disposed between and electrically connecting a first metal level to a second metal level, where the first bimetallic pillar includes a first metal strip adjacent to a second metal strip.

With continued reference to FIG. 5, embodiments of this invention include a fuse element. The fuse element including a first bimetallic pillar disposed between and electrically connecting a first metal level to a second metal level, where the first bimetallic pillar includes a first metal strip adjacent to a second metal strip, and where a first width of the second metal strip is substantially equal to a width of the bimetallic pillar.

With continued reference to FIG. 5, embodiments of this invention include a fuse element. The fuse element including a first bimetallic pillar disposed between and electrically connecting a first metal level to a second metal level, where the first bimetallic pillar includes a first metal strip adjacent to a second metal strip, where the second metal strip is physically disposed between a bottom surface of the first metal strip and the first metal level.

With continued reference to FIG. 5, an embodiment where a width of the first metal strip is less than a first width of the second metal strip, and where a second width of the second metal strip is substantially equal to a width of the first bimetallic pillar.

With continued reference to FIG. 5, an embodiment where a resistivity of the second metal strip is greater than a resistivity of the first metal strip.

With continued reference to FIG. 5, an embodiment further including a metal via disposed between, and electrically connecting, a lower metal line of the first metal level to a first upper metal line of the second metal level, where the bimetallic pillar is disposed between, and electrically connecting, the lower metal line of the first metal level to a second upper metal line of the second metal level.

With continued reference to FIG. 5, an embodiment where the metal via includes a barrier layer surrounding vertical side surfaces and a lower horizontal surface of the metal via, where the barrier layer includes the same material as the second metal strip.

With continued reference to FIG. 5, an embodiment where the second metal strip directly contacts a sidewall and a bottom surface of the first metal strip.

With continued reference to FIG. 5, an embodiment further including a second bimetallic pillar disposed between and electrically connecting the first metal level to the second metal level, where both the first bimetallic pillar and the second bimetallic pillar are disposed between, and electrically connect, a lower metal line of the first metal level to an upper metal line of the second metal level.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A fuse element comprising:

a first bimetallic pillar disposed between and electrically connecting a first metal level to a second metal level, wherein the first bimetallic pillar comprises a first metal strip adjacent to a second metal strip; and an interlayer dielectric disposed between the first metal level and the second metal level, wherein opposing sidewalls of the first metal strip and the second metal strip directly contact the interlayer dielectric.

2. The fuse element according to claim 1, wherein a width of the first metal strip is less than a first width of the second metal strip, and wherein a second width of the second metal strip is substantially equal to a width of the first bimetallic pillar.

3. The fuse element according to claim 1, wherein a resistivity of the second metal strip is greater than a resistivity of the first metal strip.

4. The fuse element according to claim 1, further comprising:

a metal via disposed between, and electrically connecting, a lower metal line of the first metal level to a first upper metal line of the second metal level, wherein the bimetallic pillar is disposed between, and electrically connecting, the lower metal line of the first metal level to a second upper metal line of the second metal level.

5. The fuse element according to claim 4, wherein the metal via comprises a barrier layer surrounding vertical side surfaces and a lower horizontal surface of the metal via, wherein the barrier layer comprises the same material as the second metal strip.

6. The fuse element according to claim 1, wherein the second metal strip directly contacts a sidewall and a bottom surface of the first metal strip.

7. The fuse element according to claim 1, further comprising:

a second bimetallic pillar disposed between and electrically connecting the first metal level to the second metal level, wherein both the first bimetallic pillar and the second bimetallic pillar are disposed between, and electrically connect, a lower metal line of the first metal level to an upper metal line of the second metal level.

8. A fuse element comprising:

a first bimetallic pillar disposed between and electrically connecting a first metal level to a second metal level, wherein the first bimetallic pillar comprises a first metal strip adjacent to a second metal strip, and wherein a first width of the second metal strip is substantially equal to a width of the first bimetallic pillar; and an interlayer dielectric disposed between the first metal level and the second metal level, wherein opposing sidewalls of the first metal strip and the second metal strip directly contact the interlayer dielectric.

9. The fuse element according to claim 8, wherein a width of the first metal strip is less than a second width of the second metal strip.

10. The fuse element according to claim 8, wherein a resistivity of the second metal strip is greater than a resistivity of the first metal strip.

11. The fuse element according to claim 8, further comprising:

a metal via disposed between, and electrically connecting, a lower metal line of the first metal level to a first upper metal line of the second metal level, wherein the first bimetallic pillar is disposed between, and electrically connecting, the lower metal line of the first metal level to a second upper metal line of the second metal level.

12. The fuse element according to claim 11, wherein the metal via comprises a barrier layer surrounding vertical side surfaces and a lower horizontal surface of the metal via, wherein the barrier layer comprises the same material as the second metal strip.

13. The fuse element according to claim 8, wherein the second metal strip directly contacts a sidewall and a bottom surface of the first metal strip.

14. The fuse element according to claim 8, further comprising:

a second bimetallic pillar disposed between and electrically connecting the first metal level to the second metal level, wherein both the first bimetallic pillar and the second bimetallic pillar are disposed between, and electrically connect, a lower metal line of the first metal level to an upper metal line of the second metal level.

15. A fuse element comprising:

a first bimetallic pillar disposed between and electrically connecting a first metal level to a second metal level, wherein the first bimetallic pillar comprises a first metal strip adjacent to a second metal strip, wherein the second metal strip is physically disposed between a bottom surface of the first metal strip and the first metal level; and an interlayer dielectric disposed between the first metal level and the second metal level, wherein opposing sidewalls of the first metal strip and the second metal strip directly contact the interlayer dielectric.

16. The fuse element according to claim 15, wherein a width of the first metal strip is less than a first width of the second metal strip, and wherein a second width of the second metal strip is substantially equal to a width of the first bimetallic pillar.

17. The fuse element according to claim 15, wherein a resistivity of the second metal strip is greater than a resistivity of the first metal strip.

18. The fuse element according to claim 15, further comprising:

a metal via disposed between, and electrically connecting, a lower metal line of the first metal level to a first upper metal line of the second metal level, wherein the first bimetallic pillar is disposed between, and electrically connecting, the lower metal line of the first metal level to a second upper metal line of the second metal level, wherein the metal via comprises a barrier layer surrounding vertical side surfaces and a lower horizontal surface of the metal via, wherein the barrier layer comprises the same material as the second metal strip.

19. The fuse element according to claim 15, wherein the second metal strip directly contacts a sidewall and a bottom surface of the first metal strip.

20. The fuse element according to claim 15, further comprising:

a second bimetallic pillar disposed between and electrically connecting the first metal level to the second metal level, wherein both the first bimetallic pillar and the second bimetallic pillar are disposed between, and electrically connect, a lower metal line of the first metal level to an upper metal line of the second metal level.

* * * * *